(12) United States Patent
Tanabe et al.

(10) Patent No.: US 9,448,468 B2
(45) Date of Patent: Sep. 20, 2016

(54) REFLECTIVE MASK BLANK AND REFLECTIVE MASK, AND METHODS FOR MANUFACTURING REFLECTIVE MASK BLANK AND REFLECTIVE MASK

(71) Applicant: TOPPAN PRINTING CO., LTD., Tokyo (JP)

(72) Inventors: Masahito Tanabe, Tokyo (JP); Norihito Fukugami, Tokyo (JP); Yo Sakata, Tokyo (JP); Tooru Komizo, Tokyo (JP); Takashi Haraguchi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 252 days.

(21) Appl. No.: 14/227,705

(22) Filed: Mar. 27, 2014

(65) Prior Publication Data

US 2014/0212795 A1    Jul. 31, 2014

Related U.S. Application Data

(63) Continuation of application No. PCT/JP2012/006087, filed on Sep. 25, 2012.

(30) Foreign Application Priority Data

Sep. 28, 2011 (JP) .................. 2011-213244
Sep. 29, 2011 (JP) .................. 2011-214573

(51) Int. Cl.
*G03F 1/24* (2012.01)
*G03F 1/22* (2012.01)
*G03F 1/00* (2012.01)

(52) U.S. Cl.
CPC ................. *G03F 1/24* (2013.01); *G03F 1/146* (2013.01)

(58) Field of Classification Search
CPC ..................................... G03F 1/24; G03F 1/22
See application file for complete search history.

(56) References Cited

U.S. PATENT DOCUMENTS

| 5,536,603 A * | 7/1996 | Tsuchiya ............... G03F 1/14 216/12 |
| 6,368,942 B1 | 4/2002 | Cardinale |
| 2009/0148781 A1 | 6/2009 | Kamo et al. |
| 2009/0220869 A1 | 9/2009 | Takai |

(Continued)

FOREIGN PATENT DOCUMENTS

| EP | 2 333 816 A1 | 6/2011 |
| JP | 2002-217097 | 8/2002 |

(Continued)

OTHER PUBLICATIONS

International Search Report mailed Nov. 27, 2012, in corresponding International Application No. PCT/JP2012/006087.

(Continued)

*Primary Examiner* — Stephen Rosasco

(57) ABSTRACT

A reflective mask blank, a reflective mask, and methods for manufacturing those, which suppress reflectance at a light-shielding frame. The reflective mask includes a substrate, a multilayered reflective layer formed on the substrate, an absorption layer formed on the multilayered reflective layer, and a frame-shaped light-shielding frame area at which the absorption layer has a film thickness larger than a film thickness at other areas. The multilayered reflective layer is diffused and mixed at the light-shielding frame area through melting.

8 Claims, 14 Drawing Sheets

(56) References Cited

U.S. PATENT DOCUMENTS

| | | |
|---|---|---|
| 2010/0304277 A1 | 12/2010 | Oh |
| 2011/0104595 A1 | 5/2011 | Hayashi et al. |
| 2011/0275013 A1 | 11/2011 | Lee et al. |

FOREIGN PATENT DOCUMENTS

| | | |
|---|---|---|
| JP | 2003-338461 | 11/2003 |
| JP | 2009-141223 | 6/2009 |
| JP | 2009-212220 | 9/2009 |
| JP | 2011-044520 | 3/2011 |
| JP | 2011-151202 | 8/2011 |
| JP | 2012-209398 | 10/2012 |
| JP | 2012-209481 | 10/2012 |
| WO | WO 2010/007955 A1 | 1/2010 |

OTHER PUBLICATIONS

Kamo et al., "Light-shield border impact on the printability of extreme-ultraviolet mask", Journal of Micro/Nanolithography, MEMS, and MOEMS, Apr.-Jun. 2011, vol. 10(2), 9 pp.

Kamo et al., "EUVL practical mask structure with light shield area for 32nm half pitch and beyond", Photomask Technology, 2008, 11 pp.

* cited by examiner

REFLECTIVE MASK BLANK AND REFLECTIVE MASK, AND METHODS FOR MANUFACTURING REFLECTIVE MASK BLANK AND REFLECTIVE MASK

CROSS-REFERENCE TO RELATED APPLICATIONS

This application is a continuation application under 35 U.S.C. §111(a) of International Application PCT/JP2012/006087, filed Sep. 25, 2012, and claims foreign priority benefit of Japanese Patent Application 2011-213244, filed Sep. 28, 2011, and Japanese Patent Application 2011-214573, filed Sep. 29, 2011, the contents of which are incorporated herein by reference.

TECHNICAL FIELD

The present invention relates to a reflective mask blank and a reflective mask, and methods for manufacturing those. In particular, the present invention relates to a reflective mask blank and a reflective mask utilized in a semiconductor fabrication device using EUV lithography whose light source is extreme ultraviolet ray (EUV), and methods for manufacturing those.

BACKGROUND ART

Description of EUV Lithography

Associated with miniaturization of semiconductor devices in recent years, EUV lithography using, as a light source, EUV having a wavelength around 13.5 nm has been proposed. EUV lithography has to be performed in vacuum since the wavelength of a light source is short and the light absorption property is very high with EUV lithography. In addition, the refractive indices of most substances are values slightly smaller than 1 in the wavelength range of EUV. Therefore, the conventionally used transmission type dioptric system cannot be used in EUV lithography, and a catoptric system is used. Thus, it is necessary to us a reflective mask as a photomask (hereinafter, also referred to as mask) that becomes the master copy, since the conventional transmissive mask cannot be used.

Description of EUV Mask and Blank Structure

A reflective mask blank, which becomes the basis of such reflective mask, is obtained by sequentially forming, on a low thermal-expansion substrate, a multilayered reflective layer having high reflectance against the wavelength of an exposure light source, and an absorption layer configured to absorb the wavelength of the exposure light source, and further forming, on the reverse surface of the substrate, a reverse-surface conductive film for electrostatic chucking in an exposure machine. There are also EUV masks with a structure having a buffer layer between the multilayered reflective layer and the absorption layer. When processing the reflective mask blank into a reflective mask, the absorption layer is partially stripped together with a buffer layer if the structure has a buffer layer, using EB lithography and etching technology to form a circuit pattern consisting of absorption parts and reflective parts. Optical images reflected by the reflective mask produced in such manner are transcribed onto a semiconductor substrate via a catoptric system.

Description of Reflectance and Film Thickness of Absorption Layer of EUV Mask

With an exposure method using the catoptric system, a shadow of a pattern itself is generated when the film thickness of the absorption layer is large, since light is emitted at an incidence angle (ordinarily 6°) inclined by a predetermined angle from a perpendicular direction with respect to the mask surface. Since the reflection intensity at the shadowed part is smaller than a part that is not shadowed, a reduced contrast is obtained, resulting in a transcription pattern having blurred edge parts and deviation from a designed size. This is referred to as shadowing, and is a fundamental problem for reflective masks.

In order to prevent blurred edge parts of the pattern and deviation from the designed size, reducing the film thickness of the absorption layer and lowering the height of the pattern are effective. However, reducing the film thickness of the absorption layer results in deterioration in the light-shielding ability at the absorption layer, reduction in transcription contrast, and deterioration in accuracy of the transcription pattern. If the absorption layer is too thin, the contrast necessary for maintaining accuracy of the transcription pattern cannot be obtained. Thus, since it becomes a problem if the film thickness of the absorption layer is too large or too small, the film thickness at present is generally set between 50 to 90 nm, and the reflectance of EUV light at the absorption layer is about 0.5 to 2%.

Description of Multiple Exposures of Adjacent Chips

On the other hand, when forming a transcription circuit pattern on a semiconductor substrate using a reflective mask, chips with multiple circuit patterns are formed on a single layer of semiconductor substrate. In some cases, there is an overlapping area of chip outer peripheral portions of adjacent chips. This is due to chips being arranged in high density for the purpose of improving productivity based on an intention of increasing the number of chips that can be obtained from a single sheet of wafer. In this case, such area is exposed for multiple times (at maximum four times) (multiple exposures). The chip outer peripheral portions of transcription pattern correspond to outer circumferential portions of the mask, and are portions where an absorption layer is formed, ordinarily. However, as described above, since the reflectance of EUV light at the absorption layer is about 0.5 to 2%, there has been a problem of the chip outer peripheral portions being sensitized due to the multiple exposures. Therefore, it has become necessary to provide, at the chip outer peripheral portion on the mask, an area (hereinafter, referred to as a light-shielding frame) that has higher light-shielding ability against EUV light than an ordinary absorption layer.

In order to solve such a problem, reflective masks having a light-shielding frame with high light-shielding ability against exposure light source wavelengths are proposed, including a reflective mask having formed therein a trench that is dug from an absorption layer into a multilayered reflective layer of the reflective mask, a reflective mask having formed therein a film that has a larger film thickness than an absorption layer at a circuit pattern area, and a reflective mask in which reflectance of a multilayered reflective layer is reduced by laser irradiation or ion implantation on the reflective mask (cf. Patent Literature 1 and 2).

CITATION LIST

Patent Literature

[PTL 1] Japanese Laid-Open Patent Publication No. 2009-212220

[PTL 2] Japanese Laid-Open Patent Publication No. 2011-44520

SUMMARY OF THE INVENTION

Problems to be Solved by the Invention

However, in the reflective mask disclosed in Patent Literature 1, in order to form a light-shielding frame, since it is necessary to process a total of 80 layers of Si and Mo at a dug-in portion of a multilayered reflective layer after creating a mask pattern, very complicated conditions are essential for forming the dug-in portion through dry etching. In addition, apart from etching of the main pattern, since lithography and etching have to be performed in two separate steps, there will be deterioration in the throughput. Furthermore, generation of particles from a processed surface cannot be avoided, resulting in deterioration of mask quality at a defective surface. Further, with this method, since the multilayered reflective layer is stripped after the absorption layer located above is stripped, there is a concern of the reflectance becoming not low but high when mere several layers of the multilayered reflective layer are remaining. In addition, when a reflective mask blank whose absorption layer has a large film thickness is used, there is a concern of the circuit pattern collapsing due to rinsing etc., since the circuit pattern becomes miniaturized and a pattern with a high aspect ratio is formed at the step of creating the reflective mask when compared to an absorption film having a common film thickness. When the light-shielding frame is formed on the reflective mask through laser irradiation or ion implantation, since there is loss of laser light or ion due to objects other than the multilayered reflective layer, the laser light or ion has to be emitted while taking into consideration this amount of loss. Furthermore, in films other than the multilayered reflective layer, there is a concern of reduced absorption factor in the wavelength of an exposure light source for the absorption layer as a result of damage caused by irradiation using laser light or ion.

In a reflective mask disclosed in Patent Literature 2, in order to form a light-shielding frame, reflectance is lowered by destroying a multilayered reflective layer with laser irradiation. Beam diameter for laser irradiation is as fine as several tens of μm, which is excellent for local processing. However, there is a concern of deterioration in throughput when forming the light-shielding frame surrounding a pattern area at a width of about 1 mm to 10 mm.

Therefore, an objective of the present invention is to provide: a reflective mask and a reflective mask blank, which prevent deterioration of mask quality due to defects caused by particles, which prevent collapsing of minute patterns, which do not allow damage to an absorption layer, which do not undergo change in optical properties, and which have a light-shielding frame having high light-shielding ability; and methods for manufacturing those.

In addition, an objective of the present invention is to provide: a reflective mask and a reflective mask blank, which improve throughput for forming a light-shielding frame, which suppress reflectance, and which have a light-shielding frame with excellent quality; and methods for manufacturing those.

Solution to the Problems

The present invention is a reflective mask blank comprising: a substrate; a multilayered reflective layer formed on the substrate; an absorption layer formed on the multilayered reflective layer; and a frame-shaped light-shielding frame area at which the absorption layer has a film thickness larger than a film thickness at other areas.

Preferably, a dug-in portion is formed on the substrate at the light-shielding frame area, and the film thickness of the absorption layer is larger at the light-shielding frame area by a level of the dug-in portion than other areas.

Preferably, the multilayered reflective layer is diffused and mixed at the light-shielding frame area through melting.

In addition, preferably, a protective layer is included between the multilayered reflective layer and the absorption layer.

The present invention is also method for manufacturing a reflective mask blank, and the method includes at least the following steps of:

(1) preparing a low thermal-expansion substrate and forming a resist film on a surface of the low thermal-expansion substrate;

(2) forming a reverse pattern of a frame-shaped light-shielding frame pattern on the resist film;

(3) forming a light-shielding frame area on a surface of the low thermal-expansion substrate by etching the low thermal-expansion substrate using, as a mask, the reverse pattern formed on the resist film;

(4) stripping the resist film, and then laminating a multilayered reflective layer, a protective layer, and an absorption layer in this order on the surface of the low thermal-expansion substrate on which the light-shielding frame area is formed; and (5) planarizing a surface of the deposited absorption layer with CMP (Chemical Mechanical Polishing) method.

The present invention is also a reflective mask having a circuit pattern formed on a surface within the light-shielding frame area of the reflective mask blank described above.

The present invention is also a method for manufacturing a reflective mask, and the method includes at least the following steps of:

(1) preparing a reflective mask blank described above, and forming a resist film on the absorption layer;

(2) patterning the resist film, and forming a circuit pattern by etching the absorption layer using, as a mask, the patterned resist film; and (3) stripping the resist film.

Preferably, the method further includes a step of melting, through high temperature annealing treatment, to diffuse and mix the multilayered reflective layer in the light-shielding frame area to reduce reflectance of the light-shielding frame area when compared to reflectance of areas other than the light-shielding frame area.

Preferably, the high temperature annealing treatment is performed by heating, with a halogen lamp or a xenon lamp, the light-shielding frame area after forming a shield on areas other than the light-shielding frame area such that heat is not conveyed thereto.

Advantageous Effects of the Invention

In the present invention, a light-shielding frame pattern is etched on a substrate at a stage before depositing a multilayered reflective layer, and, by utilizing a level difference formed thereon, a light-shielding frame is formed by increasing the film thickness of the absorption layer. As a result, particles will fundamentally not attach to the circuit pattern. Therefore, it is possible to provide: a reflective mask and a reflective mask blank, which prevent deterioration of mask quality due to defects caused by particles, which prevent collapsing of minute patterns, which do not allow damage to an absorption layer, which do not undergo change in optical properties, and which have a light-shielding frame having high light-shielding ability; and methods for manufacturing those.

In the present invention, the multilayered reflective layer is melted with a high temperature annealing treatment to reduce reflectance and form the light-shielding frame. As a result, when compared to a technique of digging such as dry etching, and reducing reflectance with laser irradiation; a high throughput is obtained and the steps are relatively easy, and thereby deterioration of mask quality at a defective surface can be prevented.

In addition, since the light-shielding frame is formed with a high temperature annealing treatment, the high temperature treatment can performed in a short period of time, and thereby the light-shielding frame can be easily formed without damaging areas other than the light-shielding frame. With regard to the melting of the multilayered reflective layer, even if all layers thereof are not fully melted; when certain amount thereof is melted, an absorption layer at the outermost layer blocks light, and performance that is sufficient to function as a light-shielding frame can be obtained. Since the light-shielding frame can be formed without processing a mask surface when the present technique is used, a fine quality light-shielding frame can be produced even on a defective surface.

DESCRIPTION OF EMBODIMENTS

First Embodiment

In the following a first embodiment of the present invention will be described.

Configuration of Reflective Mask

Figure 1:
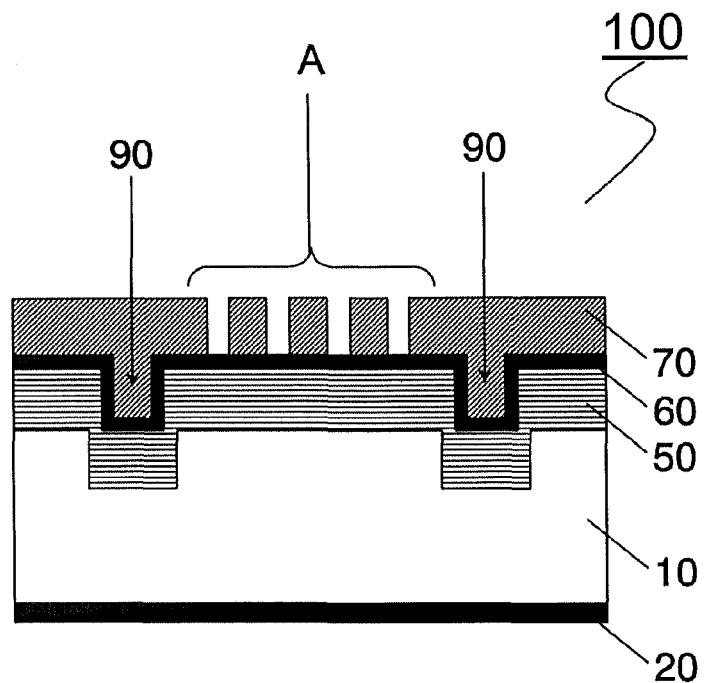
FIG. 1 shows a cross-sectional schematic diagram of the reflective mask according to a first embodiment.
Figure 2:
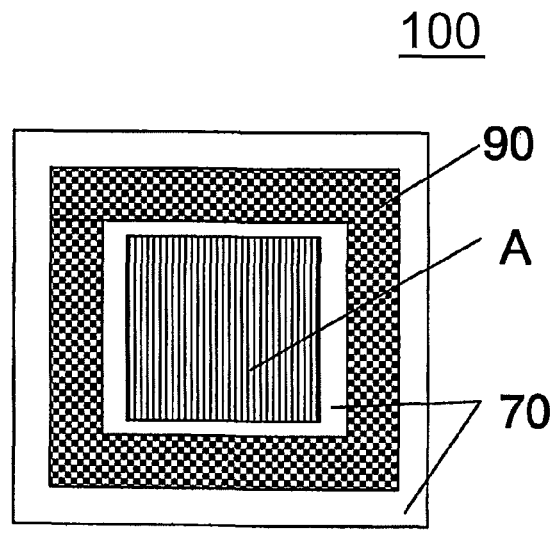
FIG. 2 shows a planar schematic diagram of the reflective mask according to the first embodiment.

The configuration of a reflective mask of the present embodiment will be described. FIG. 1 is a cross-sectional schematic diagram of a reflective mask 100 of the present invention. The reflective mask 100 is formed by laminating, on one surface of a substrate 10, a multilayered reflective layer 50 configured to reflect exposure light, a protective layer 60 configured to protect the multilayered reflective layer 50, and an absorption layer 70 configured to absorb the exposure light, and laminating, on the other surface of the substrate 10, a conductive film 20. In addition, by digging into a light-shielding frame part on the substrate 10, and increasing the film thickness of the absorption layer by the amount of level difference at the dug-in portion, a light-shielding frame area 90 is formed and a circuit pattern A is formed inside the light-shielding frame area 90. FIG. 2 is a planar schematic diagram of the reflective mask 100 of the present invention. As the substrate 10, for example, a substrate having low-thermal-expansion property can be used.

Configuration of Reflective Mask Blank

Figure 3:
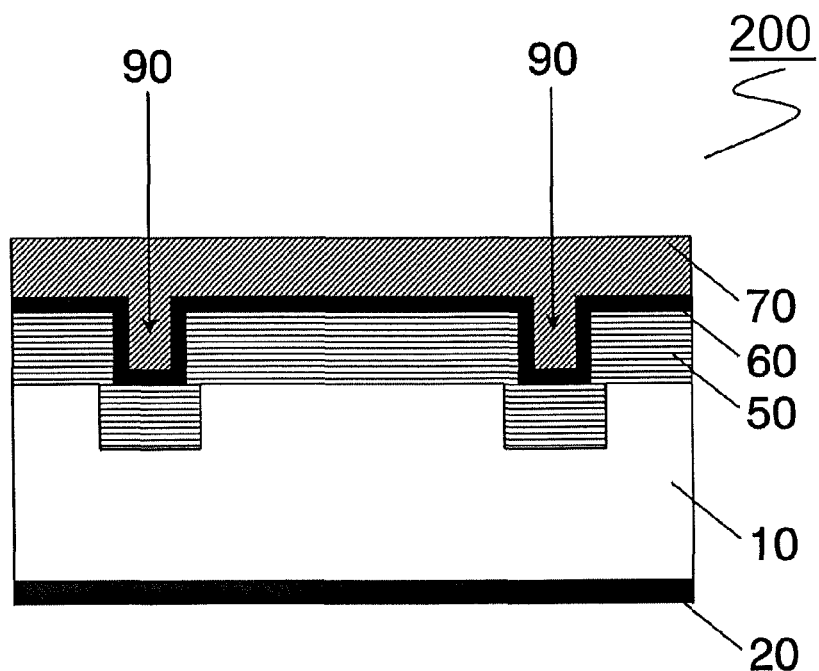
FIG. 3 shows a cross-sectional schematic diagram of a reflective mask blank according to the first embodiment.
Figure 4:
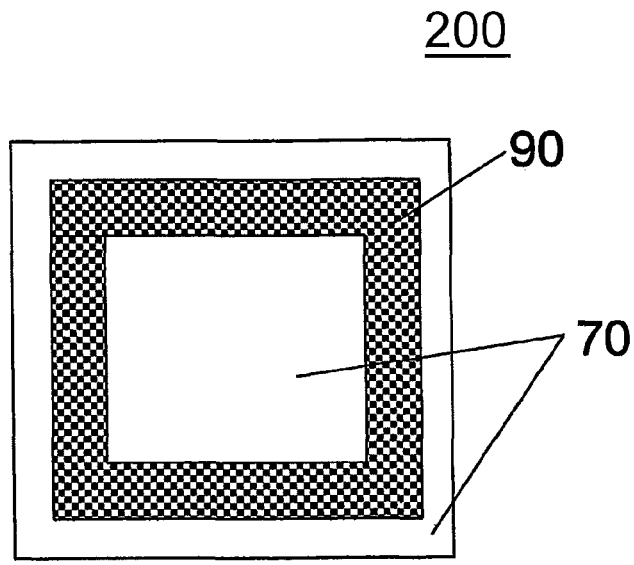
FIG. 4 shows a planar schematic diagram of the reflective mask blank according to the first embodiment.

The configuration of a reflective mask blank of the present embodiment will be described. FIG. 3 is a cross-sectional schematic diagram of a reflective mask blank 200 of the present invention. FIG. 4 is a planar schematic diagram of the reflective mask 100 of the present embodiment. The reflective mask blank 200 is a blank formed before forming the circuit pattern A in the reflective mask 100.

As the low thermal-expansion substrate, a representative example is quartz glass. However, any material can be used as long as the reflective mask and the reflective mask blank of the present embodiment can be produced.

Methods for Manufacturing Reflective Mask Blank and Reflective Mask

The reflective mask blank and the reflective mask of the present embodiment can be manufactured by manufacturing methods including steps as described below. In the following steps, etching and producing metal films etc., can be performed by appropriately using methods and devices known in the art used in photo lithography.

(1) A step of preparing a low thermal-expansion substrate as a substrate, and forming a resist film on the surface thereof.

Before the present step, a conductive film may be deposited on the reverse surface of the low thermal-expansion substrate. In addition, a metal film may be formed between the surface of the low thermal-expansion substrate and the resist film.

(2) A step of forming a resist pattern with a reverse pattern of a light-shielding frame pattern on the resist film.

(3) A step of forming a reverse pattern of the light-shielding frame pattern on a surface of the low thermal-expansion substrate by etching the low thermal-expansion substrate using the resist pattern as a mask.

When a metal film is formed on the surface of the low thermal-expansion substrate, the metal film is etched using the resist pattern as a mask, and then the surface of the low thermal-expansion substrate is etched thereafter.

(4) A step of stripping the resist, and then laminating a multilayered reflective layer, a protective layer, and an absorption layer in this order on the surface of the patterned low thermal-expansion substrate.

A buffer layer may be formed between the protective layer and the absorption layer. It should be noted that, when a metal film is formed on the surface of the low thermal-expansion substrate, the metal film is also stripped after the resist is stripped.

(5) A step of planarizing a surface of the deposited absorption layer with CMP (Chemical Mechanical Polishing) method.

With the steps described above, the reflective mask blank of the present embodiment can be manufactured.

Next, a reflective mask is manufactured with the following steps from the reflective mask blank obtained above.

(1) A step of forming a resist film on the absorption layer.

(2) A step of forming a predetermined pattern on a metal layer by etching the absorption layer using the patterned resist as a mask.

It should be noted that, when a buffer layer is formed between the protective layer and the absorption layer, the buffer layer is also etched.

(3) A step of stripping the resist.

With the steps described above, the reflective mask of the present embodiment can be manufactured.

Examples of First Embodiment

Figure 5:
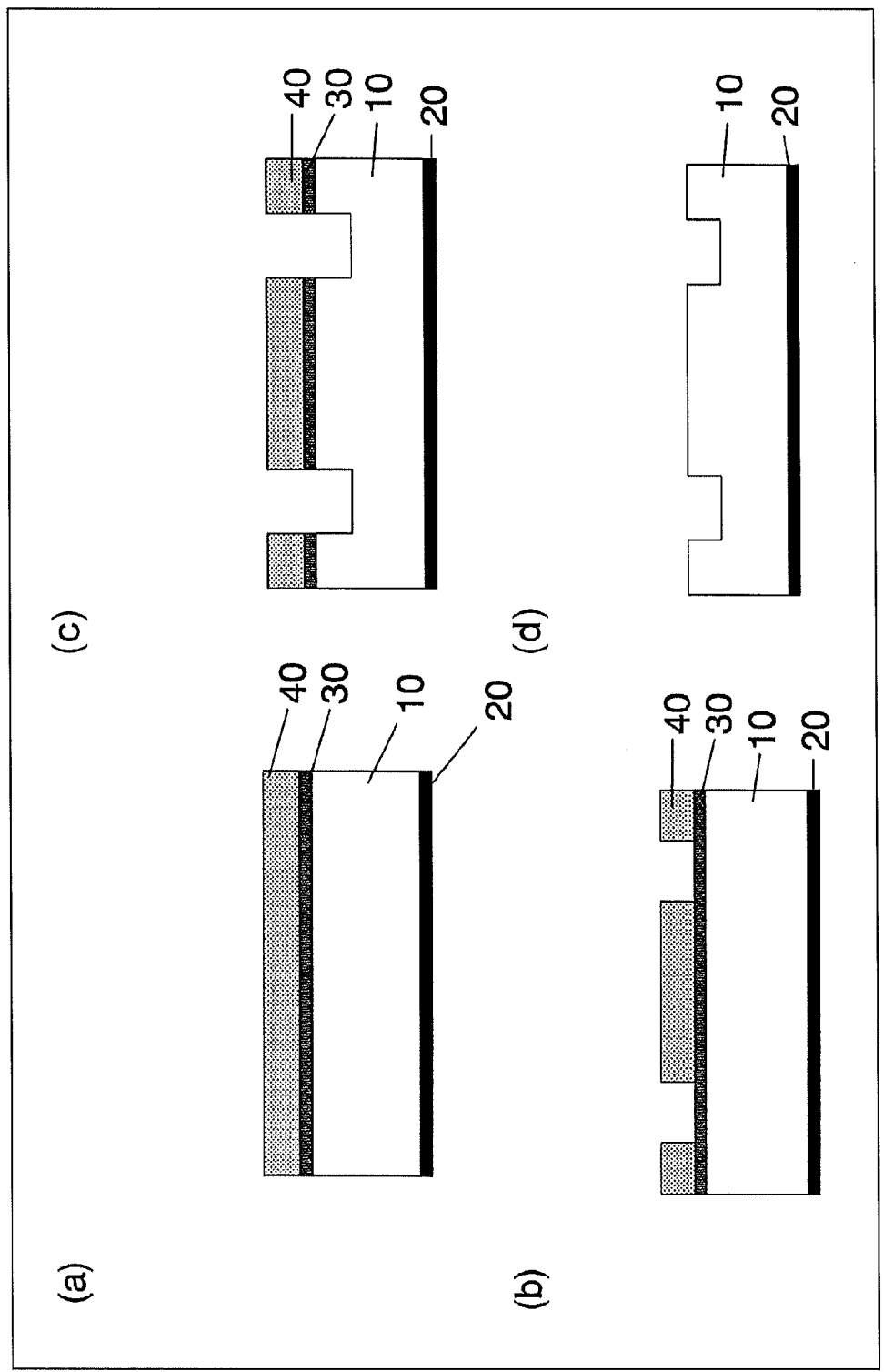
FIG. 5 is for showing production steps of the reflective mask blank according to the first embodiment.
Figure 6:
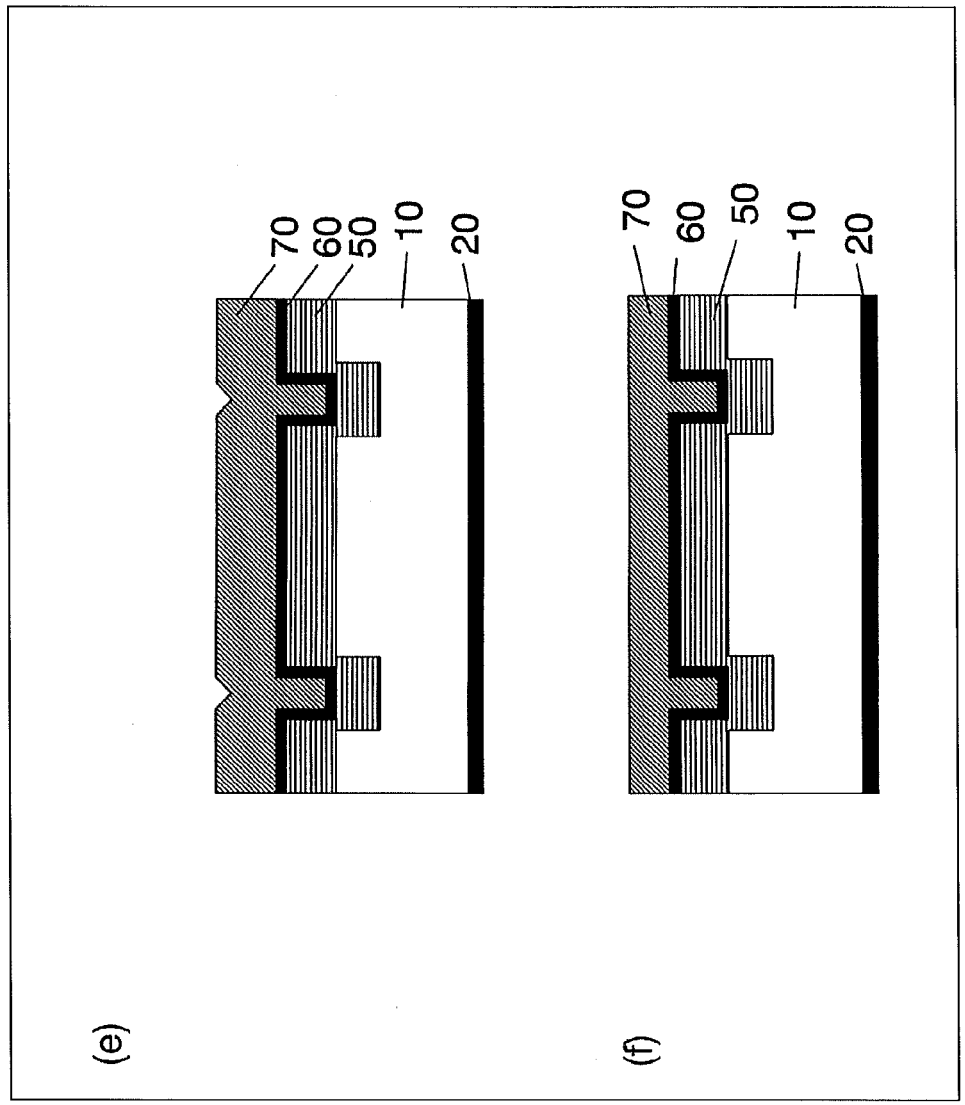
FIG. 6 is for showing production steps of the reflective mask blank according to the first embodiment.

In the following, Examples of the method for manufacturing the reflective mask blank 200 of the present embodiment will be described. FIGS. 5 and 6 show manufacturing steps for the reflective mask blank 200 of the present Example. First, the conductive film 20 was deposited on the reverse surface of the low thermal-expansion substrate 10. Chromium nitride (CrN) was used as the conductive film 20 and was deposited through sputtering. Next, a metal film 30 was deposited on the surface of the low thermal-expansion substrate 10. Chromium (Cr) was used as the metal film 30, and was deposited through sputtering. Subsequently, a resist film 40 was applied on the metal film 30. An electron-beam positive resist was used as the resist film 40, and was applied through spin coating ((a) of FIG. 5).

Next, a reverse pattern of a light-shielding frame pattern was formed on the resist film 40. An electron-beam positive resist was used for the resist film 40, and the light-shielding frame pattern was exposed with an electron-beam lithography machine, baked, and developed to form a reverse pattern of the light-shielding frame pattern formed with the resist film 40 ((b) of FIG. 5).

Next, by using the patterned resist film 40 as a mask, the metal film 30 and the low thermal-expansion substrate 10 were etched. The etching of the metal film 30 and the low thermal-expansion substrate 10 was performed through dry etching ((c) of FIG. 5). The etching of the metal film 30 was performed with a mixed gas of chlorine ($Cl_2$), oxygen ($O_2$), and helium (He). Furthermore, the etching of the low thermal-expansion substrate 10 was performed with a mixed gas of methane trifluoride ($CHF_3$) and methane tetrafluoride ($CF_4$).

Next, the resist film 40 and the metal film 30 were stripped. A sulfuric peroxide mixture was used for the stripping of the resist film 40. The stripping of the metal film 30 was performed through dry etching. Then, rinsing with the sulfuric peroxide mixture and rinsing with ammonia peroxide were performed ((d) of FIG. 5). The etching of the metal film 30 was performed with a mixed gas of chlorine ($Cl_2$), oxygen ($O_2$), and helium (He).

Next, the multilayered reflective layer 50, the protective layer 60, and the absorption layer 70 were laminated in this order on the surface of the low thermal-expansion substrate 10 that had been patterned through etching. As the multilayered reflective layer 50, a lamination film obtained by alternately laminating 40 to 50 pairs of molybdenum (Mo) and silicon (Si) was used. Ruthenium (Ru) was used as the protective layer 60. Tantalum nitride (TaN) was used as the absorption layer 70. Both of those were formed through sputtering ((e) of FIG. 6). Subsequently, the surface of the absorption layer 70 was flattened. For the flattening, CMP method was used ((f) of FIG. 6).

Figure 7:
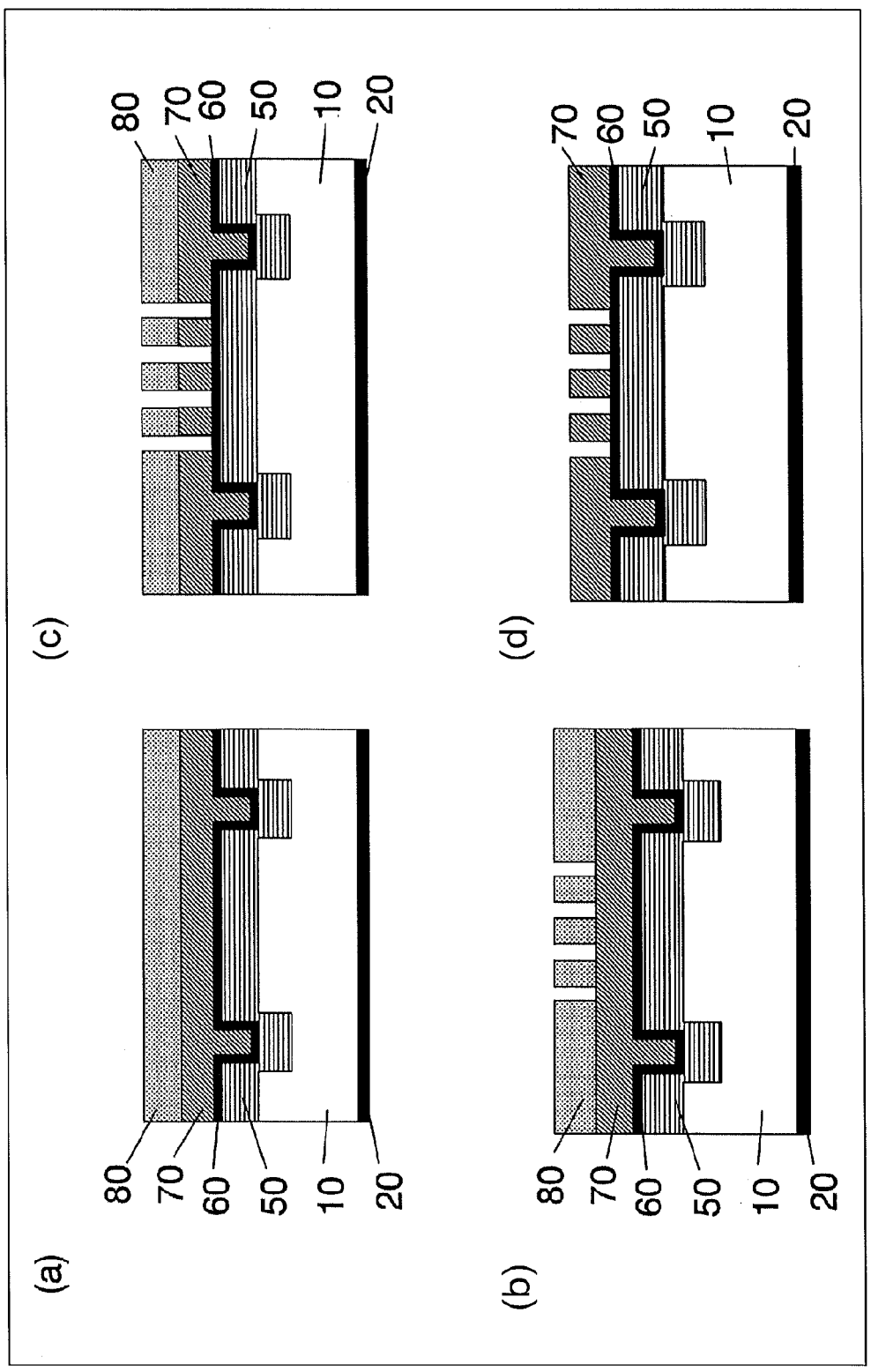
FIG. 7 is for showing production steps of the reflective mask according to the first embodiment.

Next, an Example of the method for manufacturing the reflective mask 100 of the present embodiment will be described. FIG. 7 is for showing the manufacturing steps of the reflective mask of the present Example. First, a resist film 80 was applied on the absorption layer 70 of the reflective mask blank 200 described above. An electron-beam positive resist was used as the resist film 80, and was applied through spin coating ((a) of FIG. 7).

Next, a circuit pattern was formed on the resist film 80. An electron-beam positive resist was used as the resist film 80, and the circuit pattern was exposed with an electron-beam lithography machine, baked, and developed to form a circuit pattern (circuit pattern area A) formed by the resist film ((b) of FIG. 7).

Next, the absorption layer 70 was etched using the patterned resist film 80 as a mask. The etching of the absorption layer 70 was performed through dry etching ((c) of FIG. 7). The etching of the absorption layer 70 was performed with a mixed gas of methane trifluoride ($CHF_3$) and helium (He).

Next, the resist film 80 was stripped. A sulfuric peroxide mixture was used for stripping the resist film 80 ((d) of FIG. 7).

In the manner described above, it was possible to obtain the reflective mask 100 shown in FIG. 1.

Reflectance of EUV light (wavelength: 13.5 nm) outside the light-shielding frame of the reflective mask blank 200 manufactured in the present Example was measured, and the measured reflectance was 1.24%. On the other hand, the reflectance of the light-shielding frame area 90 was 0.01%. The results are shown in Table 1.

TABLE 1

| | Light-shielding frame area | Outside light-shielding frame area |
|---|---|---|
| EUV reflectance | 0.01% | 1.24% |

Exposure with a light source of 13.5 nm EUV was performed using the reflective mask 100 manufactured in the present Example, and four adjacent chips (semiconductor devices) were transcribed on the semiconductor substrate. Even though areas corresponding to the light-shielding frame on the manufactured reflective mask 100 were partially overlapped on the adjacent chips, sensitization of resist in the areas of the semiconductor substrate was not observed.

In the present embodiment, a light-shielding frame pattern is etched on a substrate at a stage before depositing a multilayered reflective layer, and, by utilizing a level difference formed thereon, a light-shielding frame is formed by increasing the film thickness of the absorption layer. As a result, particle will fundamentally not attach to the circuit pattern of the reflective mask. In addition, collapsing of minute patterns is prevented, and there are no damages to the absorption layer and changes in optical properties. Therefore, it is possible to prevent mask defects and deterioration of quality. In addition, since the film thickness of the absorption layer is large at the light-shielding frame part, it is possible to reduce intensity of the reflected light generated at the reflective layer, and form a light-shielding frame having high light-shielding ability. Therefore, a transcription pattern can be formed with high accuracy when the reflective mask of the present embodiment is used.

Second Embodiment

In the following, a second embodiment of the present invention will be described.

Configuration of Reflective Mask of Present Invention

Figure 8:
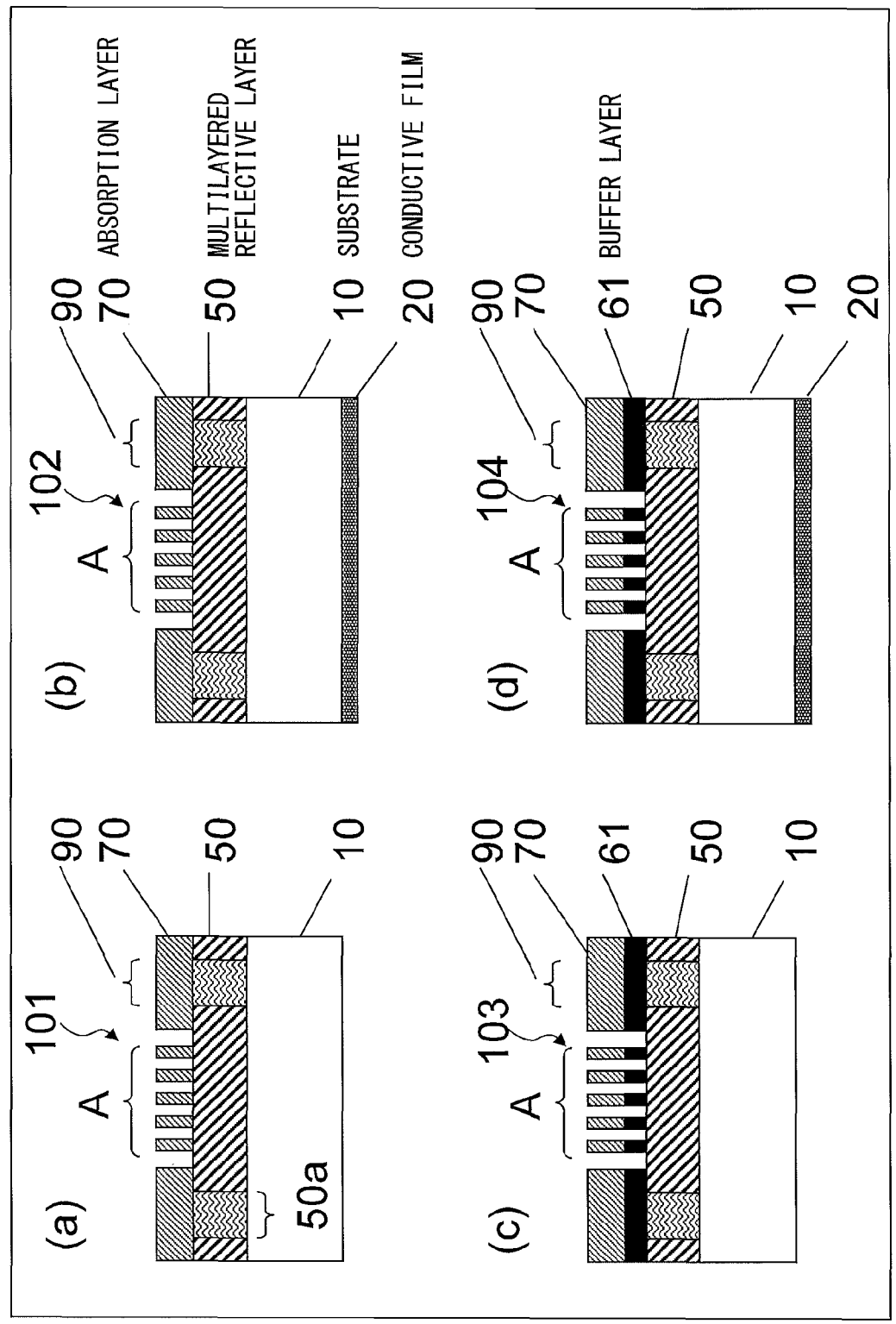
FIG. 8 shows a schematic cross section of the structure of a reflective mask according to a second embodiment.
Figure 9:
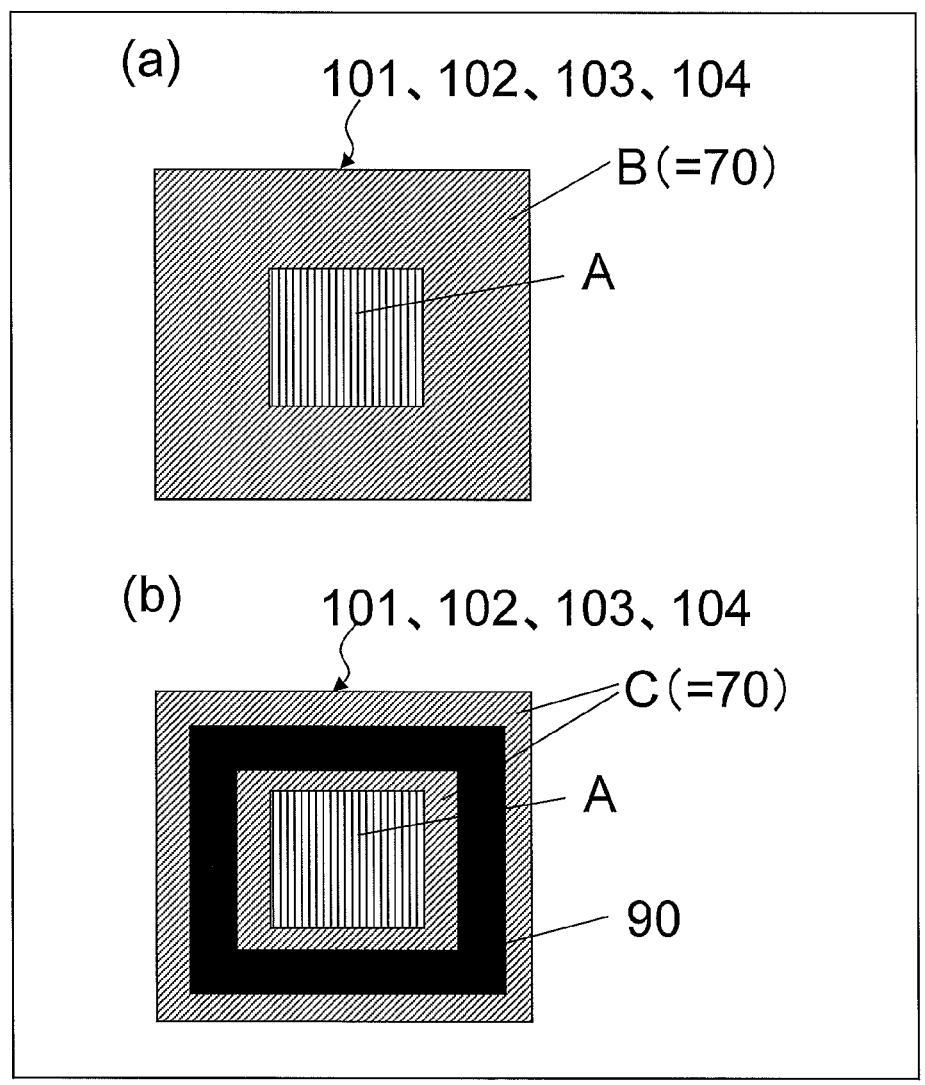
FIG. 9 shows an outline of the reflective mask according to the second embodiment.

First, the configuration of the reflective mask of the present invention will be described. In FIG. 8, (a) to (d) respectively show cross sections of reflective masks 101, 102, 103, and 104 of the present embodiment. Thus, the configuration of the reflective mask of the present embodiment may be any of 100, 200, 300, or 400. In FIG. 9, (a) is a view from the surface of the reflective mask 101, 102, 103, or 104 of the present invention shown in (a) to (d) of FIG. 8, and (b) is a distribution of reflectance of 101, 102, 103, or 104 viewed from the surface.

In the reflective mask 101 shown in (a) of FIG. 8, the multilayered reflective layer 50 and the absorption layer 70 are sequentially formed on the surface of the substrate 10. The reflective mask 102 shown in (b) of FIG. 8 has a structure in which the multilayered reflective layer 50 and the absorption layer 70 are sequentially formed on the surface of the substrate 10, and the conductive film 20 is formed on the reverse surface of the substrate 10. Thus, the reflective mask 102 in (b) of FIG. 8 has a structure obtained by forming the conductive film 20 on the reverse surface of the substrate 10 of the reflective mask 101 shown in (a) of FIG. 8. On the reflective mask 103 shown in (c) of FIG. 8, the multilayered reflective layer 50, a buffer layer 61, and the absorption layer 70 are sequentially formed on the surface of the substrate 10. The reflective mask 104 shown in (d) of FIG. 8 has a structure obtained by forming the conductive film 20 on the reverse surface of the substrate 10 of the reflective mask 103 shown in (c) of FIG. 8.

One part of the multilayered reflective layer 50 on the substrate 10 in (a) to (d) of FIG. 8 is formed into a multilayered reflective layer fused part 50a through a high temperature annealing treatment to form the light-shielding frame area 90 having a reflectance lower than other areas where the absorption layer 70 is formed. When the reflective mask 101, 102, 103, or 104 shown in (a) to (d) of FIG. 8 is viewed from the surface, an area B covered with the absorption layer 70 and the circuit pattern area A are formed as shown in (a) of FIG. 9. In addition, when the distribution of reflectance is viewed, the light-shielding frame area 90 is formed on the outer circumference of the circuit pattern area A as shown in (b) of FIG. 9, and the reflectance of EUV light of the light-shielding frame area 90 is reduced to a level that is not a problem even when multiple exposures occur.

Distribution of the reflectance of the reflective mask is as described next. That is, a distribution of three types of reflectance is obtained at: the circuit pattern area A formed of the absorption layer 70 and the multilayered reflective layer 50, resulting from partially stripping the absorption layer 70 to expose the multilayered reflective layer 50 as shown in (a) to (d) of FIG. 8; the light-shielding frame area 90 formed by performing a high temperature annealing treatment on the multilayered reflective layer 50; and areas C consisting of a frame-like area where the absorption layer 70 is remaining so as to surround the outer side of the light-shielding frame area 90, and an area where the absorption layer 70 is remaining inside the light-shielding frame area 90 so as to surround the circuit pattern area A. It should be noted that since the light-shielding frame area 90 is not visible from the surface of the mask (mask blank) in the present invention, the manner how the surface is observed is different depending on whether the observation is visual as shown in (a) of FIG. 9 or the observation is regarding the reflectance as shown in (b) of FIG. 9.

The circuit pattern area A in (b) of FIG. 9 is a repeat pattern of an area (the multilayered reflective layer 50) whose reflectance is about 60% and an area (the absorption layer 70) whose reflectance is about 0.5% to 2%, and the reflectance of the entire circuit pattern area A is about 30%.

Method for Manufacturing Reflective Mask

Next, a method for forming the multilayered reflective layer fused part 50a having reduced reflectance for the purpose of forming the light-shielding frame area 90 of the present invention will be described. Melting of the multilayered reflective layer 50 can be achieved efficiently through a high temperature annealing treatment on the light-shielding frame area using an annealing device for a small period of time.

The timing to perform the method for forming the light-shielding frame area 90 through the high temperature annealing treatment may be before or after forming the circuit pattern area, since the mask surface is not processed.

Figure 10:
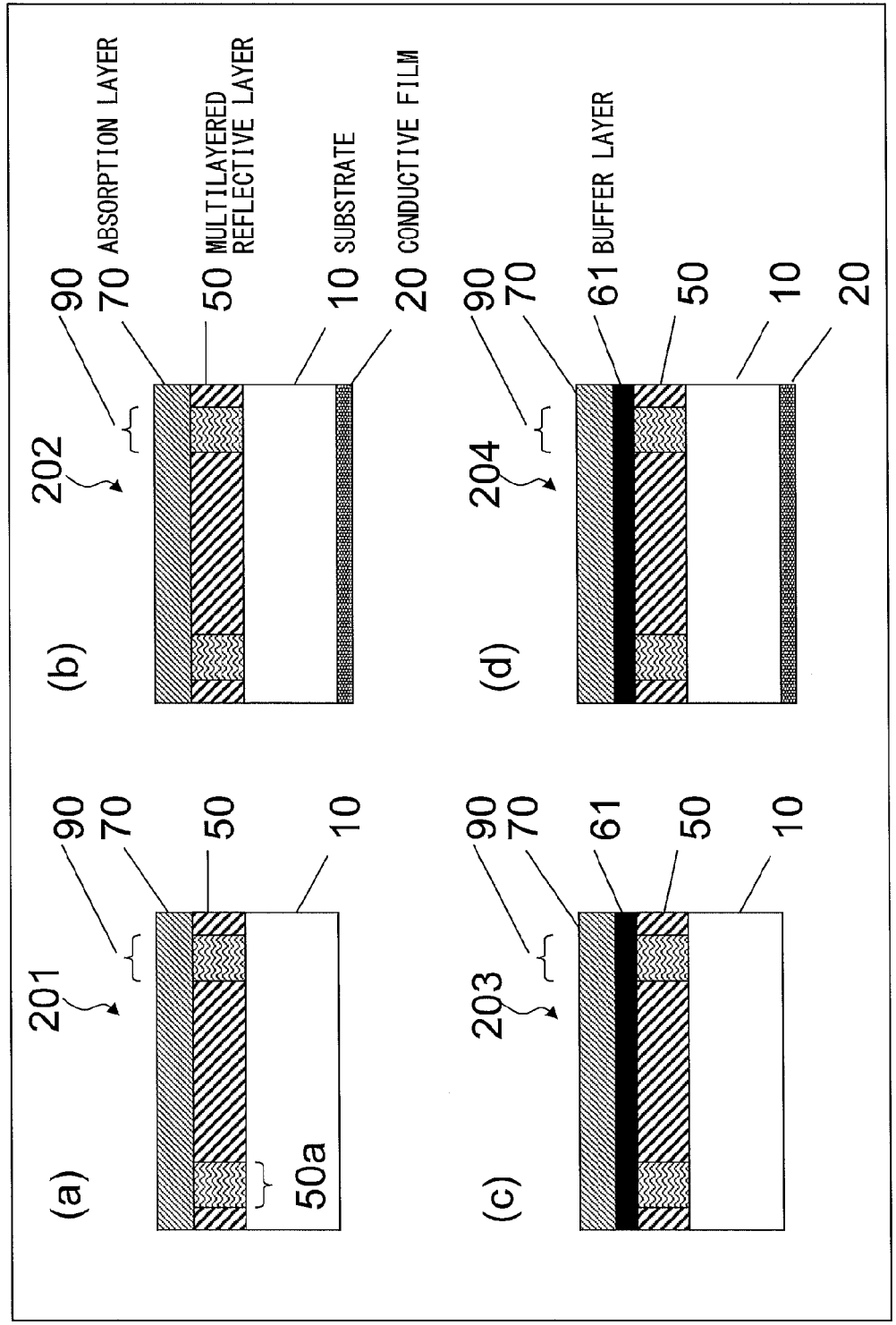
FIG. 10 shows a schematic cross section of the structure of a reflective mask blank according to the second embodiment.
Figure 11:
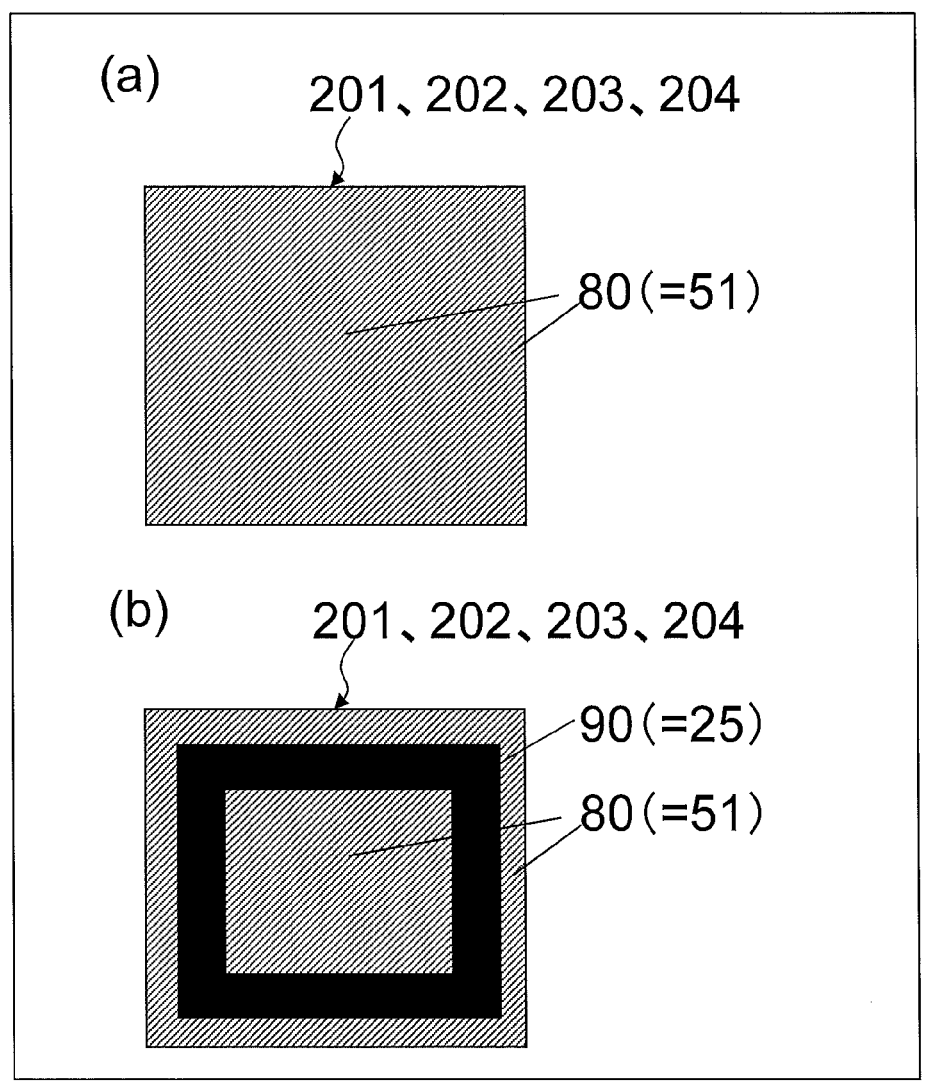
FIG. 11 shows an outline of the reflective mask blank according to the second embodiment.

In FIG. 10, (a) to (d) respectively show the structures of reflective mask blanks 201, 202, 203, and 204 after the high temperature annealing treatment when the high temperature annealing treatment is performed on the reflective mask blank before forming the circuit pattern area. In FIG. 11, (a) is a view from the surface of the reflective mask blank 201, 202, 203, or 204, and (b) is a distribution of reflectance of the reflective mask blank 201, 202, 203, or 204 viewed from the surface.

Figure 12:
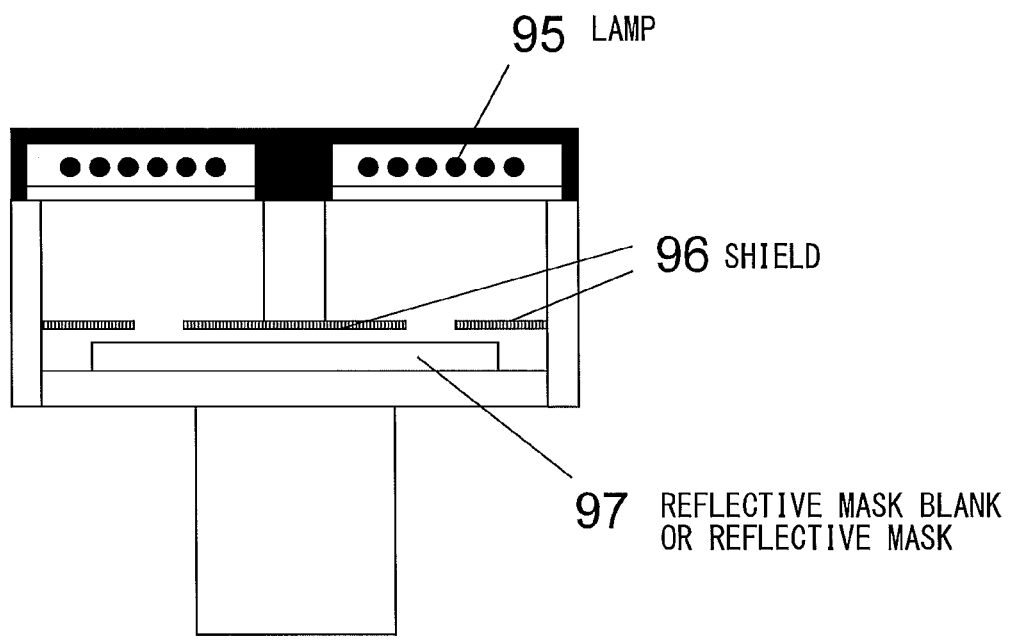
FIG. 12 shows a schematic cross section of a high temperature-annealing treatment device according to the second embodiment.

Next, a high temperature-annealing treatment device in the present invention will be described. As shown in FIG. 12, the high temperature-annealing treatment device includes annealing lamps 95 and shields 96. The shields 96 are provided to prevent heat to be conveyed to areas other than light-shielding frame area for forming the light-shielding frame, and enable heat treatment only on the light-shielding frame area.

Examples of the annealing lamps 95 include halogen lamps and xenon lamps. When a to-be-treated material 97, which is the reflective mask having formed thereon the circuit pattern area A or the reflective mask blank before having formed thereon the circuit pattern A, is placed in the high temperature-annealing treatment device, and the high temperature annealing treatment is performed on an area that is to be the light-shielding frame area 90; the multilayered reflective layer 50 in this area can be melted, diffused and mixed to lower its reflectance and form the light-shielding frame area 90.

Melting of the multilayered reflective layer 50 begins to occur at 150° C. or higher. Therefore, the annealing treatment condition may be set at 150° C. or higher with a time period of 0.001 to 0.1 seconds.

Since the annealing treatment is performed in such a short period of time, it is possible to reduce the effect on peripheral areas of the light-shielding frame area 90.

Although a temperature of 150° C. or higher is sufficient, the temperature preferably does not exceed 1000° C. since effect on the reflective mask becomes large. The light-shielding frame area 90 can be suitably created by adjusting these treatment conditions.

Melting (fusing) temperature of the multilayered reflective layer 50 is different depending on the material forming the multilayered reflective layer 50, and treatment conditions such as treatment temperature and treatment time can be appropriately selected and changed in accordance with the material etc.

In order to suppress the effect of heat to parts other than the light-shielding frame, the treatment is preferably performed at a predetermined temperature or higher but for a predetermined time or shorted. Furthermore, the treatment may be performed repeatedly using the same treatment condition, or multiple treatments may be performed while changing the treatment condition.

Examples of the material of the shields 96 include metals, polymer resins, and the like such as alumina, ceramic, and Teflon (Registered Trademark) which prevent melting, deformation, etc., at this annealing treatment temperature and which are capable of blocking heat.

Details of Configuration of Reflective Mask: Multilayered Reflective Layer

The multilayered reflective layer 50 shown in (a) and (b) of FIG. 10 is designed so as to achieve a reflectance of about 60% against EUV light around 13.5 nm, is formed from a lamination film obtained by alternately laminating 40 to 50 pairs of molybdenum (Mo) and silicon (Si), and has its uppermost layer formed from ruthenium (Ru). The layer adjacent below the Ru layer is a Si layer. The reason Mo and Si are used is because reflectance at the interface of Si and Mo can be set high since Mo and Si have small absorption (extinction coefficient) against EUV light and the refractive index difference between Mo and Si for EUV light is large. The Ru at the uppermost layer of the multilayered reflective layer plays a role as a protective layer against chemicals used during rinsing of the mask and a role as a stopper during processing of the absorption layer.

The multilayered reflective layer 50 shown in (c) and (d) of FIG. 10 is designed so as to achieve a reflectance of about 60% against EUV light around 13.5 nm, is formed from a lamination film obtained by alternately laminating 40 to 50 pairs of Mo and Si, and has its uppermost layer formed from a Si layer. The Si at the uppermost layer of the multilayered reflective layer in this case plays a role similar to the Ru described above.

Details of Configuration of Reflective Mask: Buffer Layer

The buffer layer 61 shown in (c) and (d) of FIG. 10 is provided for protecting, when pattern-correcting or etching the absorption layer 70, the Si layer which is the uppermost layer of the multilayered reflective layer 50 adjacent below the buffer layer, and is formed from a nitride (CrN) of chromium (Cr). It should be noted that it is possible to not form the buffer layer 61.

Details of Configuration of Reflective Mask: Absorption Layer

The absorption layer 70 shown in (a) to (d) of FIG. 10 is formed from a nitride (TaN) of tantalum (Ta) having high absorption factor with respect to EUV around 13.5 nm. Other materials that may be used include tantalum boron nitride (TaBN), tantalum silicon (TaSi), tantalum (Ta), and oxides thereof (TaBON, TaSiO, TaO).

The absorption layer 70 shown in (a) to (d) of FIG. 10 may be an absorption layer formed of a two-layer structure having, as an upper layer, a low reflective layer with an antireflection function against ultraviolet light (DUV light having a wavelength 190 to 260 nm). The low reflective layer is provided for improving inspectability by increasing contrast with respect to inspection wavelength of a mask defect inspection machine.

Details of Configuration of Reflective Mask: Reverse-Surface Conductive Film

Although the conductive film 20 shown in (b) of FIG. 10 and (d) of FIG. 8 is generally formed from CrN, the conductive film 20 may be formed from any material consisting of a metallic material as long as the material is electrically conductive.

Description of Reflective Mask

The configuration of the reflective mask of the present embodiment will be described.

In FIG. 8, (a) shows the reflective mask 101 on which the circuit pattern area is created using the reflective mask blank 201 shown in (a) of FIG. 10. In FIG. 8, (b) shows the reflective mask 102 on which the circuit pattern area is created using a reflective mask blank 202 shown in (b) of FIG. 10. In FIG. 8, (c) shows the reflective mask 103 on which the circuit pattern area is created using the reflective mask blank 203 shown in (c) of FIG. 10. In FIG. 8, (d) shows the reflective mask 104 on which the circuit pattern area is created using the reflective mask blank 204 shown in (d) of FIG. 10. In all cases, when the buffer layer 61 and the absorption layer 70 above the multilayered reflective layer 50 exist, the reflective mask having the buffer layer 61 and the circuit pattern area A is formed. The light-shielding frame area 90 shown in FIG. 8 is formed (50*a*) by melting the multilayered reflective layer 50 through a high temperature annealing treatment, and thereby the reflective mask having the circuit pattern area A is formed.

In such manner, the reflective mask having the light-shielding frame area 90 whose reflectance against EUV light is sufficiently smaller than that of the absorption layer areas C can be obtained. By using this reflective mask, it is possible to prevent sensitization of the chip outer peripheral portion even when multiple exposures occur, and avoid adversely affecting the quality of each chip.

Method for Manufacturing Reflective Mask from Reflective Mask Blank

Next, the method for manufacturing the reflective mask will be described. The reflective mask 101 of 102 shown in (a) or (b) of FIG. 8 and having the circuit pattern area A formed on the absorption layer 70 can be obtained by preparing the reflective mask blank 201 or 202 shown in (a) or (b) of FIG. 10, forming the resist pattern through electron-beam lithography, etching the absorption layer 70 using fluorocarbon plasma, chlorine plasma, or both plasmas if necessary, and performing a resist-stripping rinse.

In addition, the reflective mask 103 or 104 shown in (c) or (d) of FIG. 8 and having the circuit pattern area A formed on the absorption layer 70 and the buffer layer 61 can be obtained by preparing the reflective mask blank 203 or 204 shown in (c) or (d) of FIG. 10, forming the resist pattern through electron-beam lithography, etching the absorption layer 70 using fluorocarbon plasma, chlorine plasma, or both plasmas if necessary, etching the buffer layer 61 using chlorine plasma, and performing a resist-stripping rinse.

In such manner, the reflective mask having the light-shielding frame area whose reflectance against EUV light is sufficiently smaller than that of the absorption layer area can be obtained. In the present embodiment, the multilayered reflective layer is melted with a high temperature annealing treatment to reduce reflectance and form the light-shielding frame. As a result, when compared to reducing reflectance with the technique of digging such as dry etching, and laser irradiation; a high throughput is obtained and the steps are relatively easy, and thereby deterioration of mask quality at a defective surface can be prevented.

First Example of Second Embodiment

In the following, an Example of the methods for manufacturing the reflective mask blank and reflective mask of the present embodiment will be described.

Example of Method for Manufacturing Reflective Mask Blank

Figure 13:
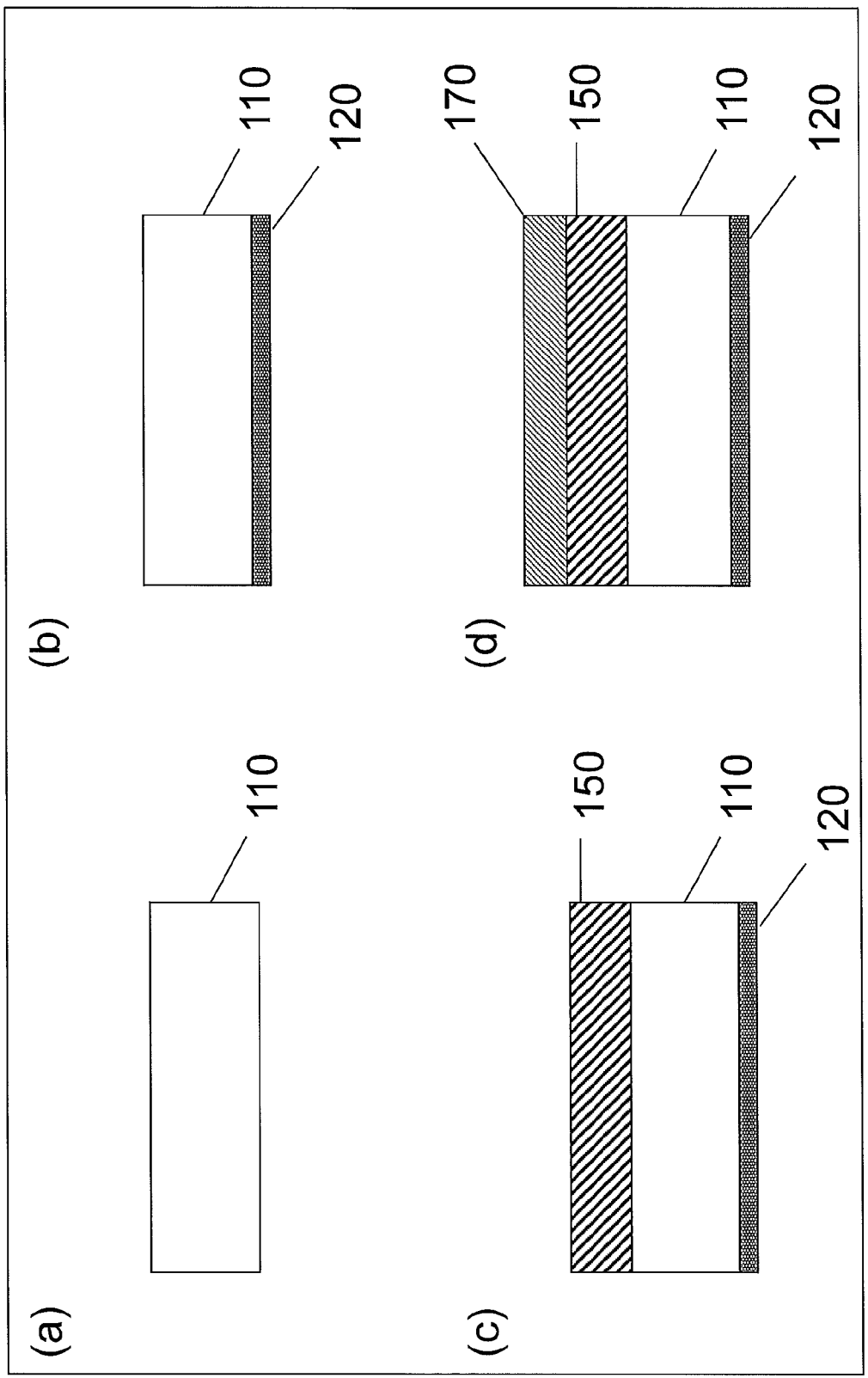
FIG. 13 is for showing production steps of the reflective mask blank according to the second embodiment.

In FIG. 13, (a) shows a low thermal-expansion glass substrate 110 prepared in the present Example. Then, on the reverse surface thereof, a conductive film 120 for electrostatic chucking was formed as shown in (b) of FIG. 13 using a sputtering device. On the glass substrate 110, a reflective layer (multilayered reflective layer) 150 that consists of 40 pairs of Mo and Si and is designed to have a reflectance of about 64% against EUV light having a wavelength of 13.5 nm is laminated as shown in (c) of FIG. 13. Subsequently, an absorption layer 170 formed from TaN was formed using a sputtering device ((d) of FIG. 13). The film thickness of the absorption layer 170 at this point was set at 50 nm. A reflective mask blank 205 of the present invention shown in FIG. 14 having a light-shielding frame area 190 whose reflectance was sufficiently smaller than that of the absorption layer area was completed by: placing the substrate in a flash lamp type high temperature-annealing device (FIG. 12) having a shield for the light-shielding frame; and performing the high temperature annealing treatment at 150° C. or higher to form a layer 150a obtained through partial melting of the multilayered reflective layer 150.

Example of Method for Manufacturing Reflective Mask

Figure 14:
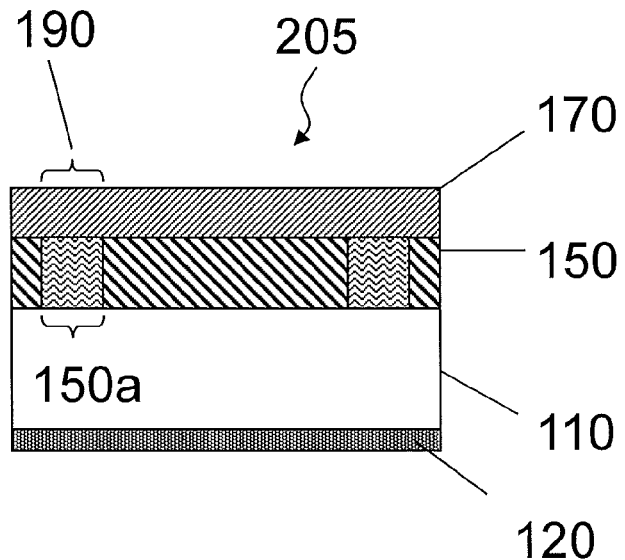
FIG. 14 is for showing production steps of the reflective mask blank according to the second embodiment.
Figure 15:
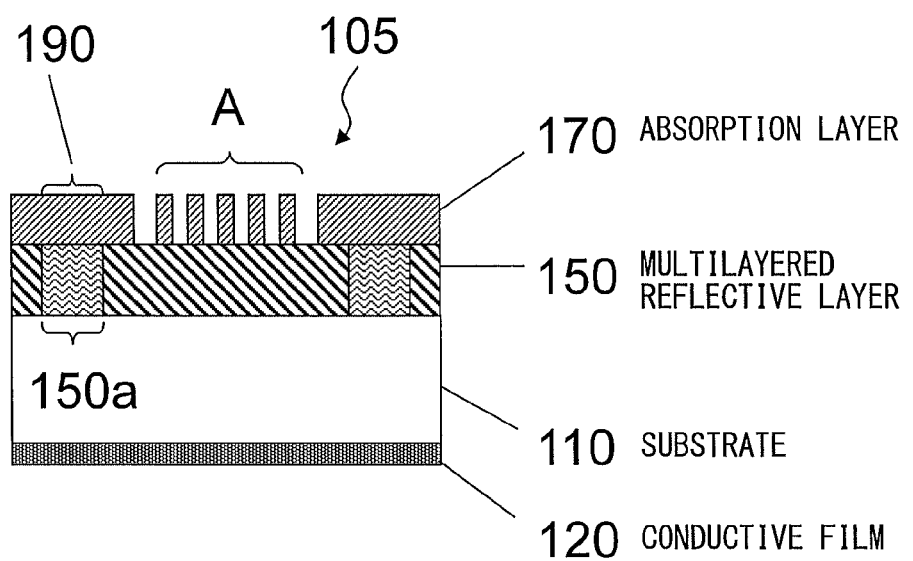
FIG. 15 is for showing production steps of the reflective mask according to the second embodiment.

A reflective mask 105 (FIG. 15) was manufactured from the reflective mask blank 205 manufactured in Example 1 and shown in FIG. 14. The manufacturing method will be shown. The reflective mask 105 having the light-shielding frame of the present embodiment was manufactured by performing, on the reflective mask blank 202, electron-beam lithography, dry etching, and a resist-stripping rinse to form the circuit pattern A on the absorption layer 170. For the electron-beam lithography, a chemically amplified positive resist FEP171 (manufactured FUJIFILM Electronic Materials Co., Ltd.) was used. A resist pattern was formed through drawing with a drawing machine JBX9000 (manufactured by JEOL Ltd.) at a dose of 15 μC/cm, and using a 2.38% TMAH (tetramethylammonium hydroxide) developer. Inductive coupling type plasma (ICP) of $Cl_2$ was applied for the etching of the absorption layer 170. As described above, the reflective mask of the present Example having the light-shielding frame area whose reflectance is sufficiently small and the circuit pattern area was completed (Table 2).

Second Example of Second Embodiment

In the following, another Example of the method for manufacturing the reflective mask blank and the reflective mask of the present embodiment will be described.

Example of Method for Manufacturing Reflective Mask Blank

Figure 16:
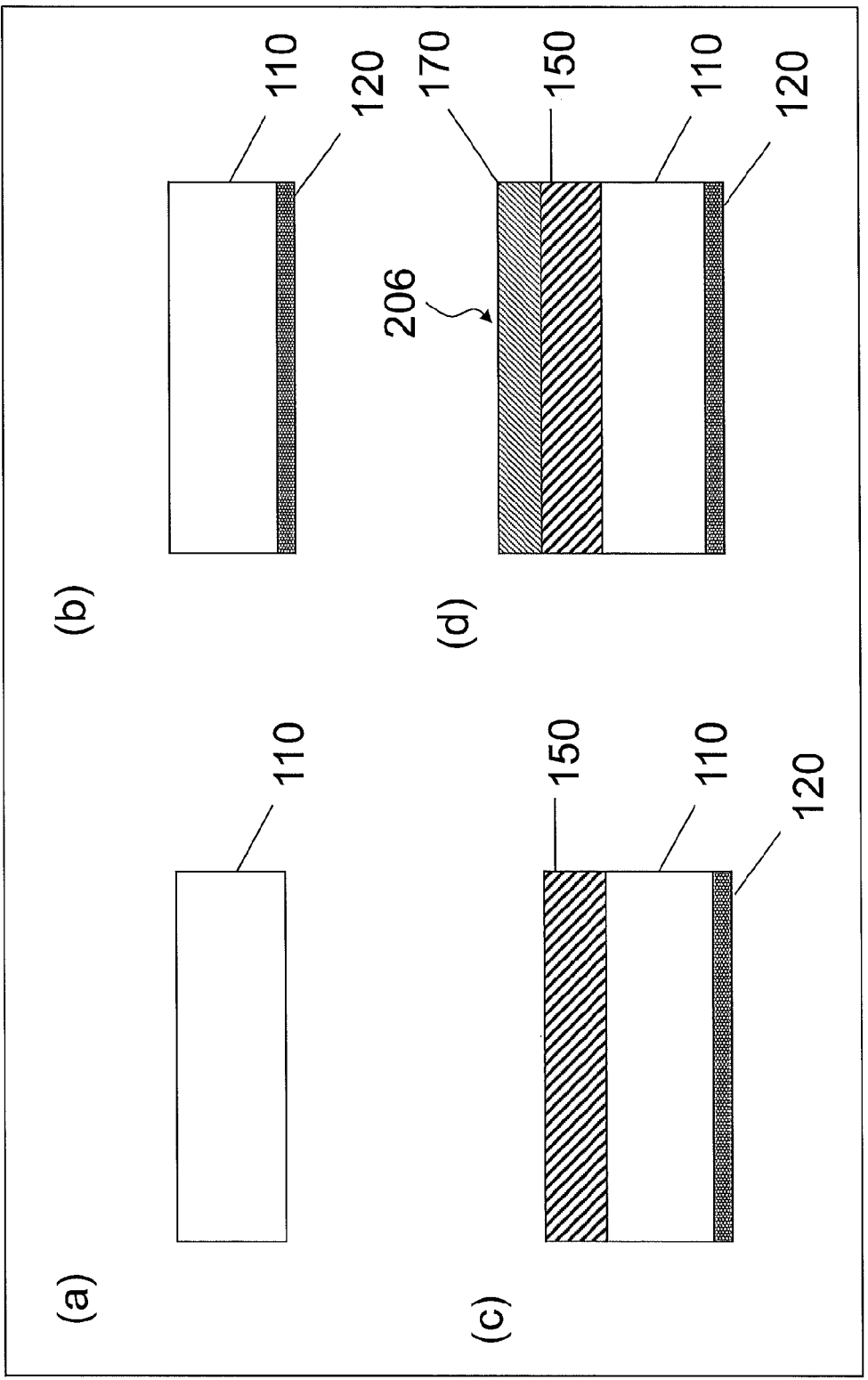
FIG. 16 is for showing production steps of the reflective mask blank according to the second embodiment.

In FIG. 16, (a) shows the low thermal-expansion glass substrate 110 prepared in the present Example. Then, on the reverse surface thereof, the conductive film 120 for electrostatic chucking was formed as shown in (b) of FIG. 16 using a sputtering device. On the glass substrate 110, the multilayered reflective layer 150 that consists of 40 pairs of Mo and Si and is designed to have a reflectance of about 64% against EUV light having a wavelength of 13.5 nm is laminated as shown in (c) of FIG. 16. Subsequently, the absorption layer 170 formed from TaN was formed using a sputtering device ((d) of FIG. 16). The film thickness of the absorption layer 170 at this point was set at 50 nm. In such manner, a reflective mask blank 206 of the present invention was completed.

Example of Method for Manufacturing Reflective Mask

Figure 17:
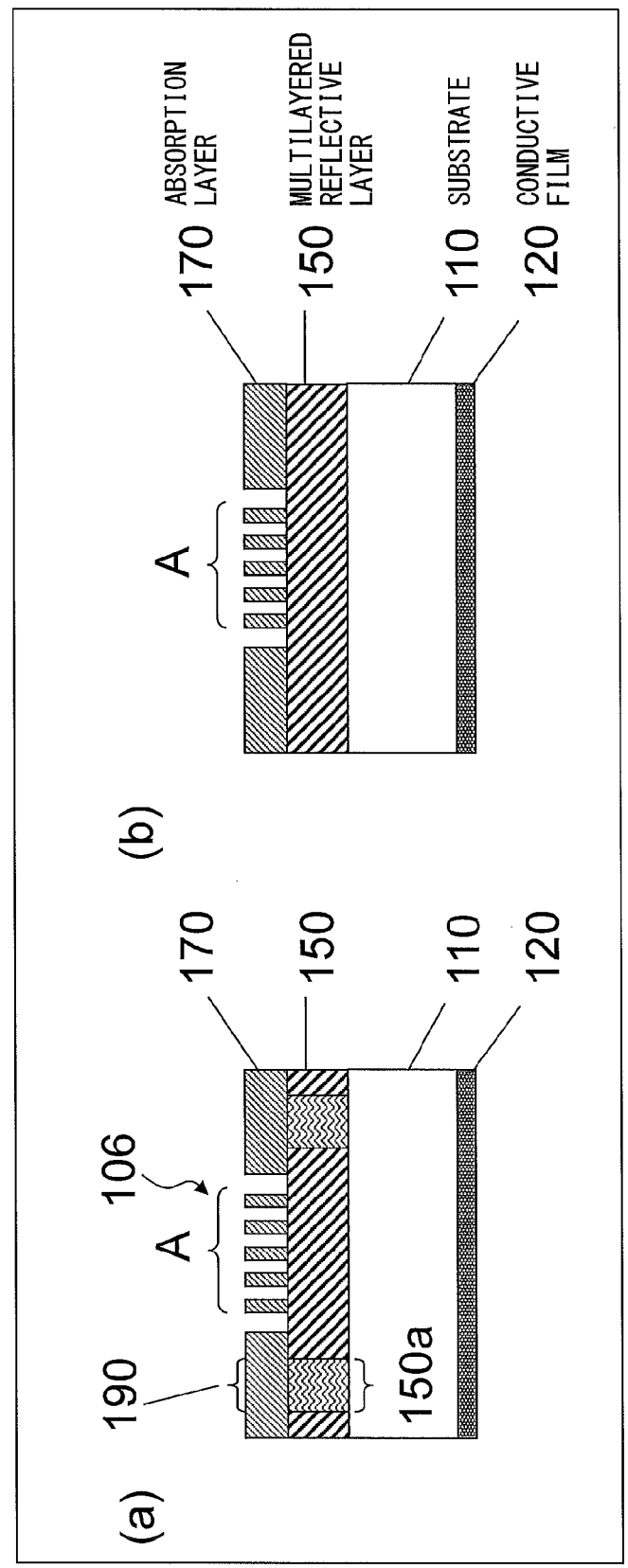
FIG. 17 is for showing production steps of the reflective mask according to the second embodiment.

A reflective mask 106 ((a) of FIG. 17) was manufactured from the reflective mask blank 206 of (d) of FIG. 16 manufactured in the present Example. The manufacturing method will be shown. The circuit pattern A ((b) of FIG. 17) was formed on the absorption layer 170 by performing, on the reflective mask blank 206, electron-beam lithography, dry etching, and a resist-stripping rinse. For the electron-beam lithography, a chemically amplified positive resist FEP171 (manufactured FUJIFILM Electronic Materials Co., Ltd.) was used. A resist pattern was formed through drawing with a drawing machine JBX9000 (manufactured by JEOL Ltd.) at a dose of 15 μC/cm, and using a 2.38% TMAH (tetramethylammonium hydroxide) developer. Inductive coupling type plasma of $Cl_2$ was applied for the etching of the absorption layer 170.

The reflective mask 106 ((a) of FIG. 17) of the present example having the light-shielding frame area 190 whose reflectance was sufficiently smaller than that of the absorption layer area was completed by: placing, after forming the circuit pattern area, the reflective mask in the flash lamp type high temperature-annealing treatment device (FIG. 12) having the shield for the light-shielding frame; and performing the high temperature annealing treatment at 150° C. or higher on the light-shielding frame area to form the layer 150a obtained through melting of the multilayered reflective layer 150.

Table 2 shows the result of comparing reflectance of the light-shielding frame area 190 and the absorption layer (non-light-shielding frame C) in the reflective masks obtained in Examples 1 and 2. It was confirmed that the reflectance of the light-shielding frame area was sufficiently smaller than the reflectance of the absorption layer area.

TABLE 2

|  | Light-shielding frame area | Absorption layer area |
| --- | --- | --- |
| EUV light reflectance | 0.00% | 1.24% |

The present invention is not limit solely to the embodiments described above, and modifications can be made as long as they do not depart from the spirit of the present invention. Various inventions can be envisioned by appropriately combining the items shown in the specification. For example, the reflectance of the light-shielding frame area can be reduced with further certainty by digging into the light-shielding frame area of the substrate and increasing the film thickness of the absorption layer by the amount of level difference thereof as shown in the first embodiment, and performing the high temperature annealing treatment on the light-shielding frame area of the multilayered reflective layer as shown in the second embodiment.

INDUSTRIAL APPLICABILITY

The present invention is useful for reflective mask blanks, reflective masks, and the like.

DESCRIPTION OF THE REFERENCE CHARACTERS 10, 110 substrate
20, 120 conductive film
30 metal film
40, 80 resist film
50, 150 multilayered reflective layer
50a, 150a multilayered reflective layer fused part
60 protective layer
61 buffer layer
70, 170 absorption layer
90, 190 light-shielding frame area
95 annealing lamp
96 shield
97 to-be-treated material
100, 101, 102, 103, 104, 105, 106 reflective mask
200, 201, 202, 203, 204, 205, 206 reflective mask blank

The invention claimed is:

1. A reflective mask blank comprising:
    a substrate;
    a multilayered reflective layer formed on the substrate;
    an absorption layer formed on the multilayered reflective layer; and
    a frame-shaped light-shielding frame area at which the absorption layer has a film thickness larger than a film thickness at other areas, wherein
    a dug-in portion is formed on the substrate at the light-shielding frame area, and
    the film thickness of the absorption layer is larger at the light-shielding frame area by a level of the dug-in portion than other areas.

2. The reflective mask blank according to claim 1, wherein the multilayered reflective layer is diffused and mixed at the light-shielding frame area through melting.

3. The reflective mask blank according to claim 1, further comprising a protective layer between the multilayered reflective layer and the absorption layer.

4. A reflective mask having a circuit pattern formed on a surface within the light-shielding frame area of the reflective mask blank according to claim 1.

5. A method for manufacturing a reflective mask, the method comprising at least:
    preparing a reflective mask blank according to claim 1, and forming a resist film on the absorption layer;
    patterning the resist film, and forming a circuit pattern by etching the absorption layer using, as a mask, the patterned resist film; and
    stripping the resist film.

6. The method for manufacturing the reflective mask according to claim 5, further comprising melting, through high temperature annealing treatment, to diffuse and mix the multilayered reflective layer in the light-shielding frame area to reduce reflectance of the light-shielding frame area when compared to reflectance of areas other than the light-shielding frame area.

7. The method for manufacturing the reflective mask according to claim 6, wherein the high temperature annealing treatment is performed by heating, with a halogen lamp or a xenon lamp, the light-shielding frame area after forming a shield on areas other than the light-shielding frame area such that heat is not conveyed thereto.

8. A method for manufacturing a reflective mask blank, the method comprising at least:
    preparing a low thermal-expansion substrate and forming a resist film on a surface of the low thermal-expansion substrate;
    forming a reverse pattern of a frame-shaped light-shielding frame pattern on the resist film;
    forming a light-shielding frame area on a surface of the low thermal-expansion substrate by etching the low thermal-expansion substrate using, as a mask, the reverse pattern formed on the resist film;
    stripping the resist film, and then laminating a multilayered reflective layer, a protective layer, and an absorption layer in this order on the surface of the low thermal-expansion substrate on which the light-shielding frame area is formed; and
    planarizing a surface of the deposited absorption layer with Chemical Mechanical Polishing method.

* * * * *